United States Patent
Wang et al.

(10) Patent No.: US 6,914,732 B1
(45) Date of Patent: Jul. 5, 2005

(54) SUPPORT STAND

(75) Inventors: Hung-Chi Wang, Taipei (TW); Mou-Sirn Chen, Ping-Tung Hsien (TW); Chung-Ming Kuo, Tai-Nan (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/710,853
(22) Filed: Aug. 8, 2004

(30) Foreign Application Priority Data

Apr. 9, 2004 (TW) .................................... 93109954 A

(51) Int. Cl.[7] .............................................. G02B 7/02
(52) U.S. Cl. ..................................... 359/811; 359/813
(58) Field of Search ............................... 359/811, 815, 359/823, 818, 819, 821

(56) References Cited

U.S. PATENT DOCUMENTS 4,619,681 A * 10/1986 Tetaz et al. ................. 65/29.18

* cited by examiner

Primary Examiner—Timothy Thompson
(74) Attorney, Agent, or Firm—Winston Hsu

(57) ABSTRACT

The present invention provides a support stand. The support stand includes at least one H-beam set between a light source of an exposure machine and an operating machine of that to support an optical axis of the exposure machine, at least one supporting element set on a first part of the H-beam, a signal emitter set on a second part of the H-beam, and a signal receiver, receiving a signal sent from the signal emitter, set on a third part of the H-beam. The signal emitter and the signal receiver are used for detecting an optical axis shift.

20 Claims, 5 Drawing Sheets

SUPPORT STAND

BACKGROUND OF INVENTION

1. Field of the Invention

The present invention provides a support stand, which can support an optical axis of an exposure machine.

2. Description of the Prior Art

Presently, subsidiary machines of high-energy exposure machines such as light source generators are mostly placed separately with operating machines such as steppers and scanners in semiconductor foundries to prevent operators or machines from being hurt or influenced by heat, particles, noise, vibration and high-energy radiation generated by the light source generators. Furthermore, operating machines must be placed in the clean room to prevent particles from polluting products and reducing production yields. However, it is very expensive to construct a clean room. To keep space for more operating machines, light source generators of exposure machines and operating machines are mostly placed on different floors and then the cost of foundries is reduced. In addition, there are not only optical axes and transferring lens between light source generators and operating machines located on different floors, but also some other transferring pipelines. Optical axes, transferring lens, and other transferring pipelines will overlap. So a support stand is needed for the application of exposure machines to support optical axes between light source generators of exposure machines and operating machines and to fix and place electric wires and other transferring pipelines of the machines themselves.

Please refer to FIG. 1. FIG. 1 is a schematic diagram of layout of an exposure machine according to the prior art. As shown in FIG. 1, the light source generator 110 and the operating machine 120 are placed on the first floor 130 and the second floor 131 respectively. The light source generator generates exposure light sources such as laser beams, transfers them to the operating machine 120 by an optical axis 140 and lens (not shown), and then supplies enough exposure energy for the operating machine 120. Between the light source generator 110 located on the first floor 130 and the operating machine 120 located on the second floor 131, there is not only an optical axis 140, but also many electric wires 150,151 of machines and some other transferring pipelines (not shown). In the prior art, structures to support exposure machines may use a support board 160 and a plurality of coupling mechanisms 161,162 to support, fix and place an optical axis 140, electric wires 150,151 of machines and other transferring pipelines.

However, the support board 160 and a plurality of coupling mechanisms 161,162 are usually set in place after the factory has been constructed completely. There are some other transferring pipelines that will influence the support board 160 between the floor the light source generator 110 is located on and the floor the operating machine 120 is located on. Therefore, in the prior art there are some drawbacks such as poor results for support structures and difficulty of installation. Some vibration from outside effects such as earthquakes, human touching, and construction can easily make support structures shift and twist, and then influence the location of the optical axis 140 and lens. This will cause exposure light source going through the operating machine to have a phenomenon of axes shifts and poor intensity and uniformity of the exposure light source, and thereby influence the critical dimension and the throughput of semiconductor product.

SUMMARY OF INVENTION

It is therefore an objective of the claimed invention to provide a support stand to support an optic axis between a light source generator of an exposure machine and operating machines, and to solve the problem of poor results of optic axes supported according to the prior art.

It is a second objective of the claimed invention to provide real time detection of optic axis shifts. If the optic axis shifts, a warning signal will be sent out to warn operators to adjust or stop the semiconductor process without manufacturing poor quality products.

According to the claim invention, a support stand to support an optic axis of an exposure machine is disclosed. The support stand includes at least a H-beam set between a light source of an exposure machine and an operating machine to support an optical axis of the exposure machine, at least one supporting element set on a first part of the H-beam, a signal emitter set on a second part of the H-beam, and a signal receiver, receiving a signal sent from the signal emitter, set on a third part of the H-beam. Thereof, the signal emitter and the signal receiver are used for detecting an optical axis shift.

Because the support stand of the claimed invention is an H-beam, which has some advantages such as good rigidity, small size, material standard easily obtained, easy to install, and good performance for fixing, it can prevent an optic axis shift caused by poor support performance due to outside vibration, and then make sure that the exposure light source goes through the operating machine steadily. Furthermore, the claimed invention uses a signal emitter and a signal receiver for detecting. If an optic axis shifts, a warning signal will be emitted to warn operators to adjust or stop the semiconductor process, to prevent the manufacture of poor quality products. In addition, the H-beam of the present invention is easy to assemble and disassemble, so it can reduce the occurrence of overlapping pipes and the cost of time to move pipelines.

It is to be understood that both the foregoing general description and the following detailed description are exemplary, but are not restrictive, of the invention. Other objects, advantages, and novel features of the claimed invention will become more clearly and readily apparent from the following detailed description when taken in conjunction with the accompanying drawings.

DETAILED DESCRIPTION

Figure 1:
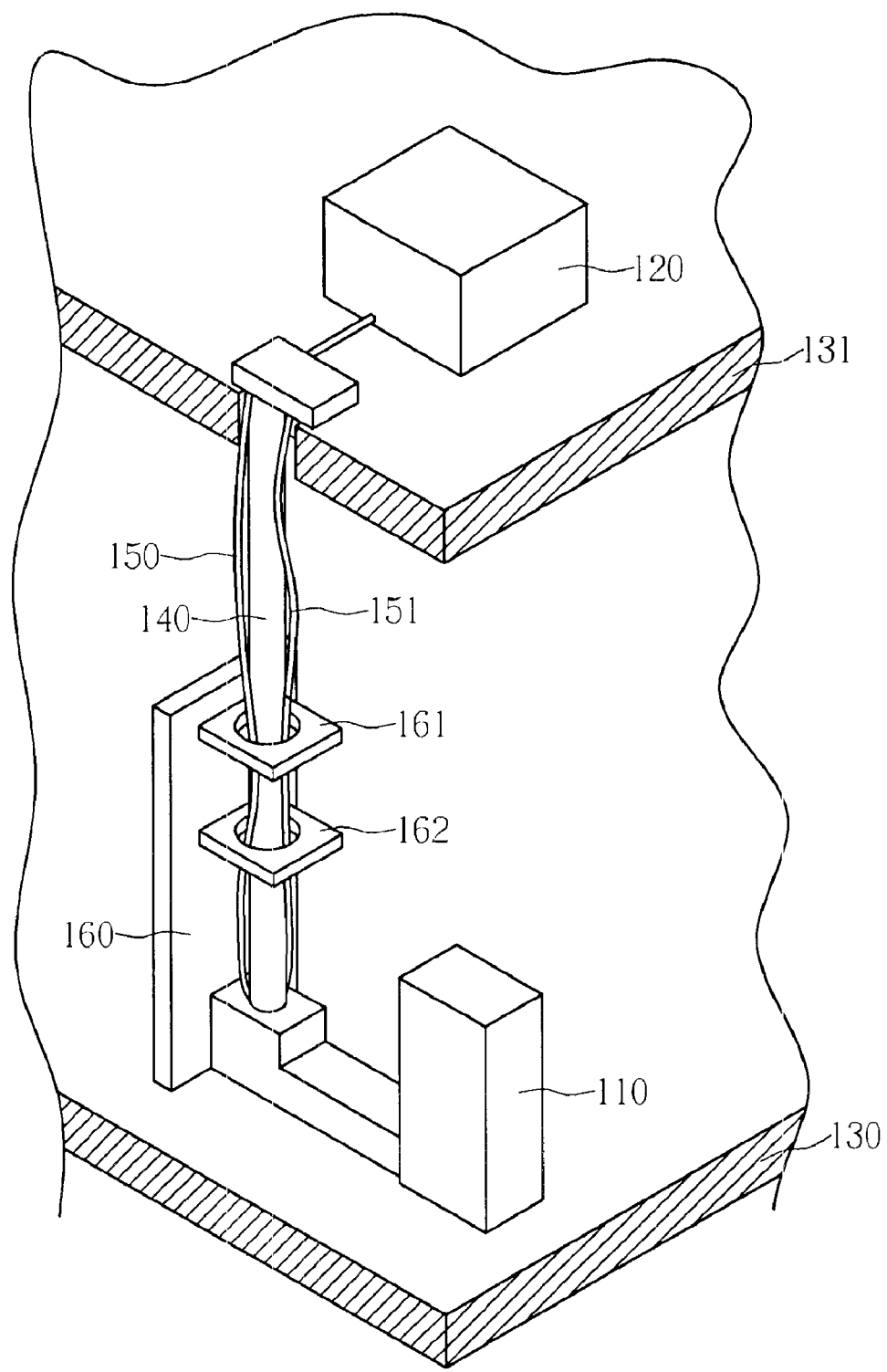
FIG. 1 is a schematic diagram of layout of an exposure machine according to the prior art.
Figure 2:
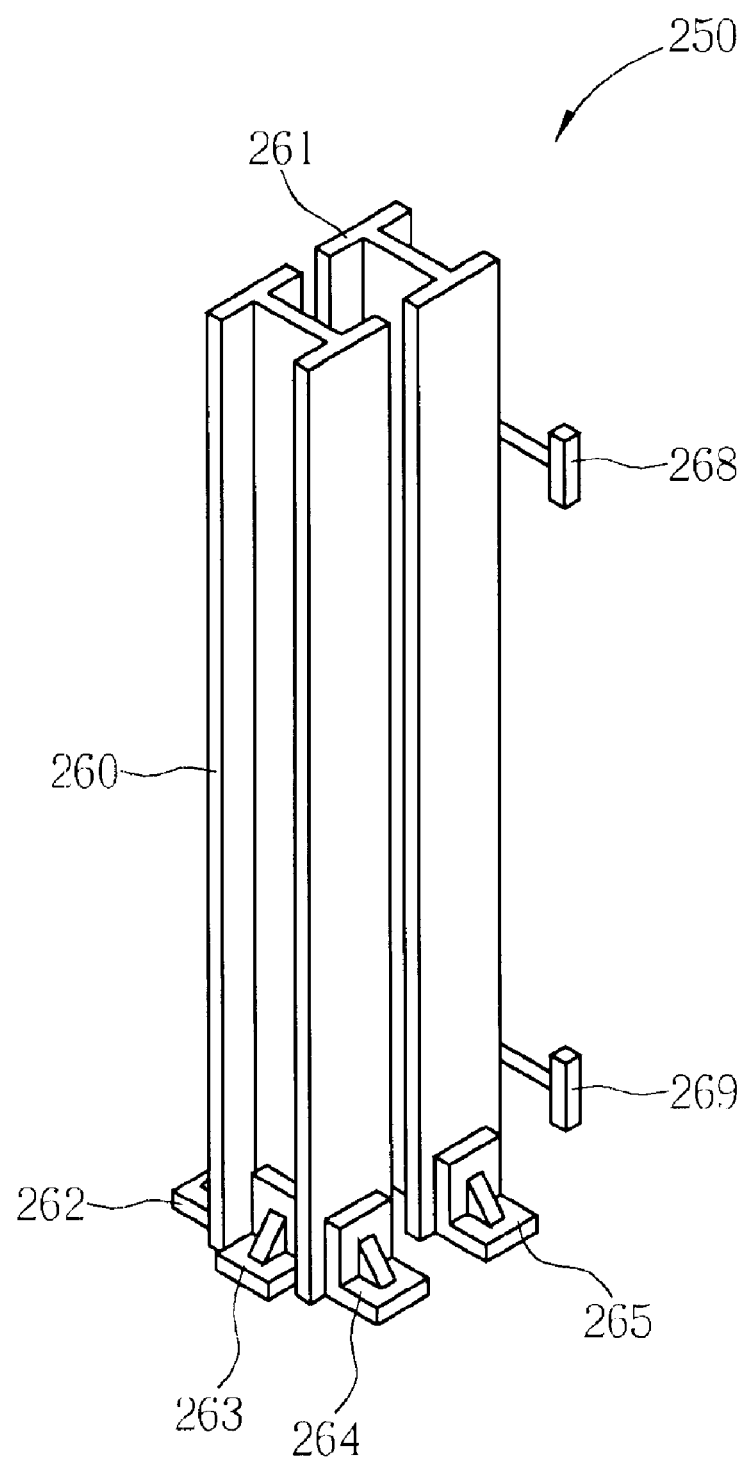
FIG. 2 is a three dimensional diagram of the support stand according to the present invention.
Figure 3:
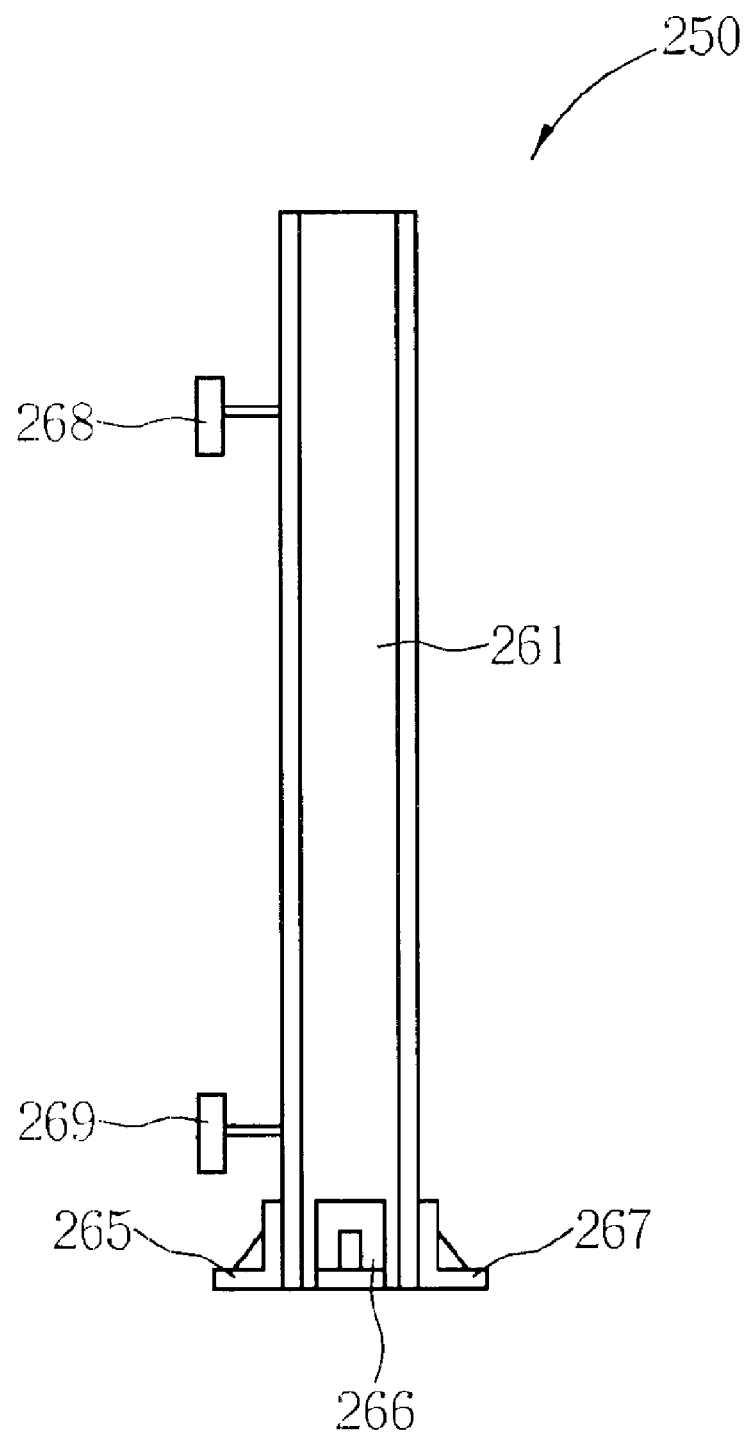
FIG. 3 is a side view of the exposure machine as shown in FIG. 2.
Figure 4:
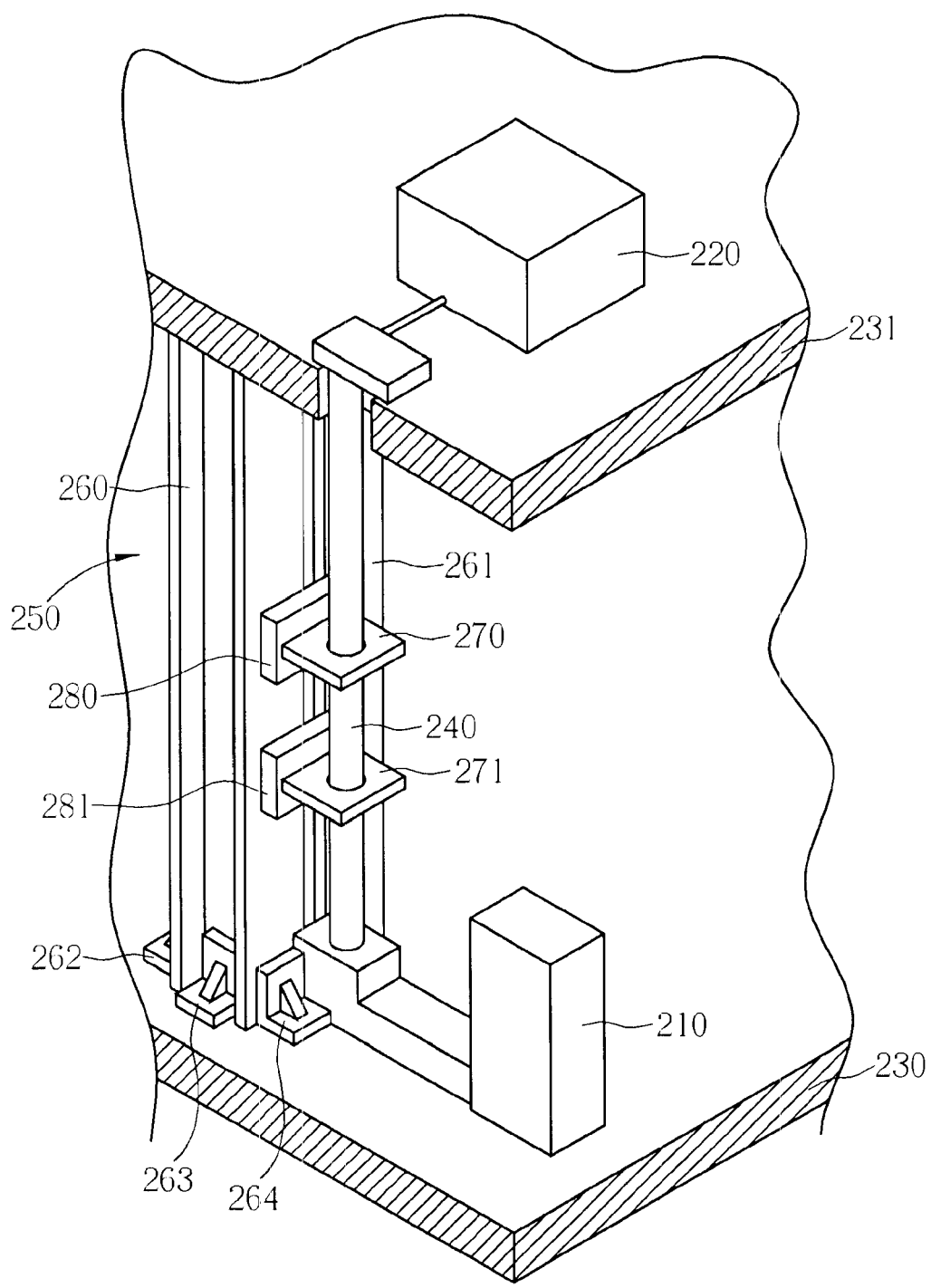
FIG. 4 is a schematic diagram of application of the support stand according to the present invention.

Please refer to FIG. 2 and FIG. 3. FIG. 2 is a three dimensional diagram of a support stand 250 of the present invention. FIG. 3 is a side view of the support stand 250, which is shown in FIG. 2. As shown in FIG. 2 and FIG. 3, the support stand 250 includes H-beams 260,261 that are parallel to each other and support elements 262–267 for jointing the H-beams 260,261 with the floor and supporting the H-beams 260,261. For example, as shown in FIG. 4, one end of the support elements 262–264 is set on the first part such as the bottom of the H-beam 260 and the other end is set on the ground of a floor 230. According to this design, the H-beam 260 and the floor 230 can be jointed well and the H-beam 260 can be supported sufficiently. Since the quantity and model of the support elements 262–267 referred to before may depend on the practical demand, the module may be different sizes and quantity such as six angle support bases. The shape of the angle support base may be the shape of "L" or a right triangle for fixing the H-beams 260,261 with the ground of the floor 230. The support element of the present invention, however, may not only be set on the position referred to before but also on the ceiling of the floor for fixing the H-beams 260, 261.

Otherwise, the support stand 250 includes at least a fix unit such as rivets or screws to link each H-beam 260,261 with each support element 262–267. For example, a rivet can tightly fix the bottom of the H-beam 260 with each end of the support elements 262–264.

Figure 5:
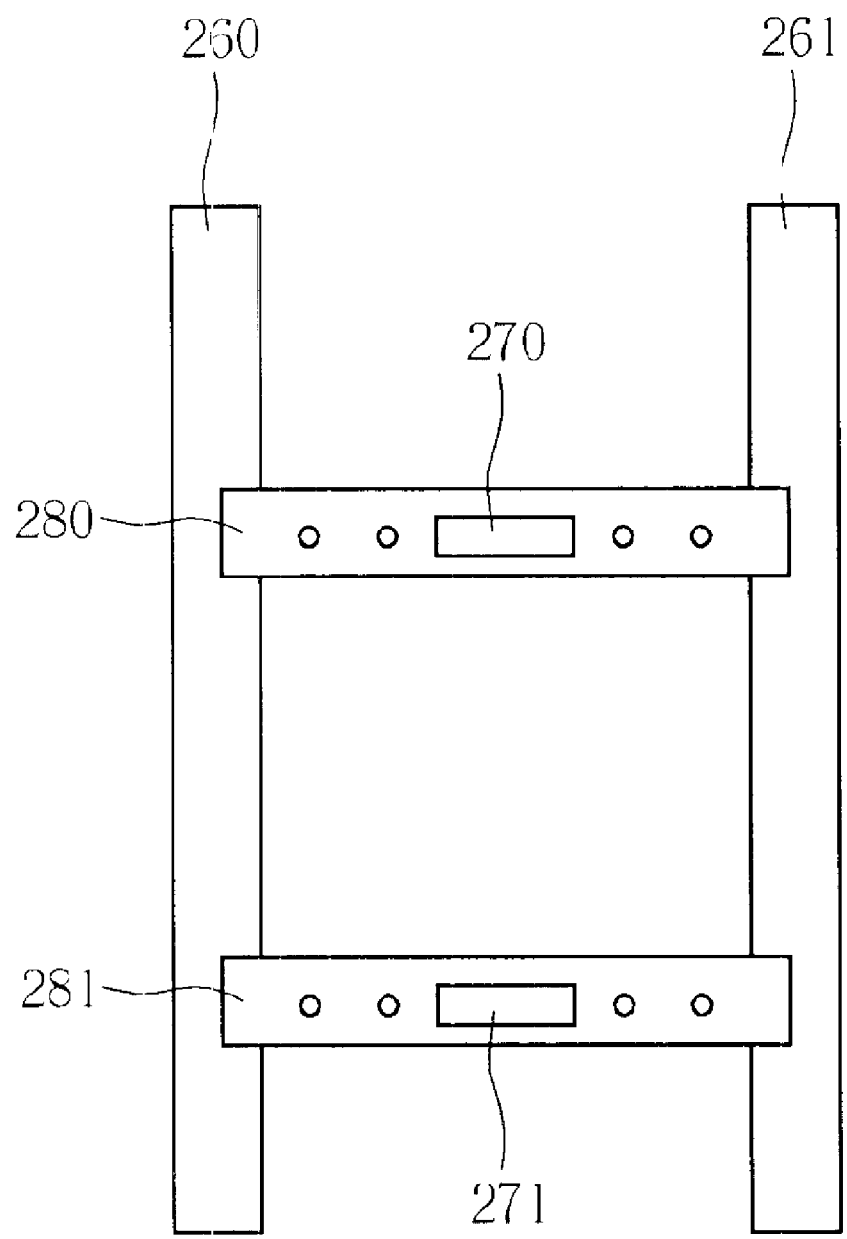
FIG. 5 is a front view of the support stand according to the present invention.

As shown in FIG. 4, support stand 250 also includes at least a coupling mechanism 270,271 and a fix board 280,281 linked with two H-beams to link the optic axis 240 with the H-beams 260,261. The structure of the coupling mechanism 270,271 of the present invention is not restricted to the structure as shown in FIG. 4. Please refer to FIG. 5. FIG. 5 is a front view of the support stand of the present invention. As shown in FIG. 5, the H-beams 260,261 include two fix boards 280,281 which may have a plurality of holes. The coupling mechanism 270,271 can fit into a choice of holes on the fix board 280,281, so that the H-beams 260,261 can adjust the distance between each other to the optimum size in order to keep away the electric wires of the machine itself and other transferring pipelines and to support the optic axis 240.

As shown in FIG. 3, the present invention also includes a signal emitter 268 set on the second part of the H-beam 261, and a signal receiver 269, receiving a signal sent from the signal emitter 268, set on the third part of the H-beam 261. Thereof, the second part and the third part are on the top and bottom of H-beam 261, respectively, and are used for detecting shifts, extensions, and twists of the H-beam 261 and then detecting the possible shifts of the optic axis 240 (shown in FIG. 4) fixed on the H-beams 260,261. Otherwise, the rivets and screws referred to before can be used to tightly link the signal emitter 268 with the H-beam 261 or the signal receiver 269 with the H-beam 261. It should be noted that the signal emitter 268 of the present invention and the signal receiver 269 interacting with it are not restricted to one set. The signal emitter 268 and the signal receiver 269 set on the second and the third part respectively are not restricted to place on the same H-beam. They can be set on different H-beams to detect the horizontal shift of the position. For example, the signal emitter 268 is set on the H-beam 261 and the signal receiver 269 is set on the same level of the H-beam 260. Therefore, if the H-beam 261 or 260 experiences deformation or shifts because of earthquakes or other outside force, at this moment, the signal receiver 269 will not receive the signal emitted from the signal emitter 268 and then the shift of the optic axis will be detected. A warning signal will be sent out from a control unit linked with the signal receiver 269 to warn operators to perform detecting and adjusting. Further, a control signal will be sent out to the exposure machine to stop the exposure process. Otherwise, the signal emitter 268 and the signal receiver 269 can be set on the fix board 280,281 where the coupling mechanism 270,271 is located. The present invention, however, is not restricted to these.

In conclusion, the application of the present invention is shown in FIG. 4. Subsidiary machines such as the light source generator 210 and the operating machine 220 such as steppers and scanners are placed on the first floor 230 and the second floor 231 respectively. Exposure light sources such as laser beams are transferred from the light source generator 210 to the operating machine 220 by an optic axis 240 to supply enough exposure energy for the operating machine 220. There are not only an optic axis 240 but also electric wires of many machines and other transferring pipelines (not shown) between the light source generator 210 set on the first floor 230 and the operating machine 220 set on the second floor 231. In order to let the distance of the H-beam of the present invention adjust to the optimum size to keep away other transferring pipelines, the support stand 250 can choose the H-beams 260, 261 of different sizes or the coupling mechanisms 270,271 can choose positions on the fix boards 280,281 which have different hole positions. Otherwise, of the present invention, electric wires of machine itself and other transferring pipelines can be fixed on the other side of the H-beams 260, 261 without the optic axis 240 passing to prevent other transferring pipelines from influencing the axis position which has been adjusted precisely. The exposure light source referred to before may be laser beams, deep-UV beams, asynchronous radiation X-rays, solid-state lasers, excimer lasers, etc.

In contrast to the prior support structure, the support stand of the present invention uses H-beams to be the support stand. It not only has advantages such as rigid structure, small volume, being easy to install, and providing good fixing performance, but also can avoid the disadvantage of the light source transferred into the operating machine shifting because of the poor support performance when outside vibration is present. If unpreventable axis shift occurs because of vibration, a signal receiver will detect axis shift from a signal emitter. Then, a warning signal will be sent out to warn operators or stop the semiconductor process to avoid manufacturing poor quality products and unnecessary waste because of axis shift. In addition, the H-beam is easy to assemble and disassemble, so it can reduce the occurrence of overlapping pipes. When it is needed to increase or disassemble pipelines, since the H-beam can be easily assembled and disassembled, pipelines can be easily moved for reducing the cost of the time to move pipelines.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A support stand comprising:
   at least a H-beam to support an optic axis between operating machines of an exposure machine and subsidiary machines of the exposure machine;
   at least a supporting element set on a first part of the H-beam;
   a signal emitter set on a second part of the H-beam; and
   a signal receiver set on a third part of the H-beam.

2. The support stand of claim 1, wherein the signal receiver functions with the signal emitter to detect deformation experienced by the support stand to detect the phenomenon of optic axis shift.

3. The support stand of claim 1 further comprising a control unit linked with the signal receiver for sending out a warning signal when the signal receiver does not receive the signal from the signal emitter.

4. The support stand of claim 1, wherein the signal emitter and the signal receiver are set on opposite side of the H-beam respectively.

5. The support stand of claim 1 further comprising at least a coupling mechanism to fix the optic axis on the H-beam.

6. The support stand of claim 5 further comprising at least a fix board for connecting with the coupling mechanism to fix and support the optic axis.

7. The support stand of claim 6, wherein the fix board comprises a plurality of holes and the coupling mechanism is capable of being fixed on the fix board by connecting with one or more of the holes.

8. The support stand of claim 1, wherein the supporting element is set on the bottom of the H-beam and connected with the ground of the structure.

9. The support stand of claim 1 further comprising at least a fix unit for assembling the supporting element to fix the H-beam on the ground of a first floor.

10. The support stand of claim 9, wherein the fix unit is rivets or screws.

11. The support stand of claim 1, wherein the supporting element is an angle support base.

12. A transfer pipeline support stand comprising:
   at least two H-beams;
   a plurality of supporting elements set on the end of H-beam to fix the H-beams;
   a signal emitter set on a first part of the H-beams;
   a signal receiver functioning with the signal emitter set on a second part of the H-beams;
   at least a fix board to connect the H-beams; and
   at least a coupling mechanism set on the fix board to fix and support a transferring pipeline.

13. The support stand of claim 12, wherein the signal emitter and the signal receiver are set on opposite sides of the H-beams respectively.

14. The support stand of claim 12 further comprising a control unit linked with signal receiver for sending out a warning signal when the signal receiver does not receive the signal from the signal emitter.

15. The support stand of claim 12, wherein the fix board comprises a plurality of holes and the coupling mechanism is capable of being fixed on the fix board by connecting with one or more of the holes.

16. The support stand of claim 12, wherein the supporting element is set on the bottom of the H-beams and connected with the ground of the structure.

17. The support stand of claim 12 further comprising at least a fix unit for assembling the supporting element to fix the H-beams on the ground of a first floor.

18. The support stand of claim 17, wherein the fix unit is rivets or screws.

19. The support stand of claim 12, wherein the signal emitter and the signal receiver are set on different H-beams.

20. The support stand of claim 12, wherein the supporting element is an angle support base.

* * * * *